(12) United States Patent
Ghinovker

(10) Patent No.: US 11,476,144 B2
(45) Date of Patent: Oct. 18, 2022

(54) SINGLE CELL IN-DIE METROLOGY TARGETS AND MEASUREMENT METHODS

(71) Applicant: KLA CORPORATION, Milpitas, CA (US)

(72) Inventor: Mark Ghinovker, Yoqneam Ilit (IL)

(73) Assignee: KLA CORPORATION, Milpitas, CA (US)

( * ) Notice: Subject to any disclaimer, the term of this patent is extended or adjusted under 35 U.S.C. 154(b) by 181 days.

(21) Appl. No.: 16/609,873

(22) PCT Filed: Sep. 30, 2019

(86) PCT No.: PCT/US2019/053716
§ 371 (c)(1),
(2) Date: Oct. 31, 2019

(87) PCT Pub. No.: WO2020/117361
PCT Pub. Date: Jun. 11, 2020

(65) Prior Publication Data
US 2020/0373182 A1    Nov. 26, 2020

Related U.S. Application Data

(60) Provisional application No. 62/774,471, filed on Dec. 3, 2018.

(51) Int. Cl.
*H01L 21/68* (2006.01)
*H01L 21/67* (2006.01)
*H01L 21/66* (2006.01)

(52) U.S. Cl.
CPC ...... *H01L 21/681* (2013.01); *H01L 21/67288* (2013.01); *H01L 22/12* (2013.01)

(58) Field of Classification Search
CPC ............ G03F 7/70633; G03F 7/70625; G03F 7/70683; G03F 7/70191; G03F 9/7088;
(Continued)

(56) References Cited

U.S. PATENT DOCUMENTS

2015/0177135 A1*   6/2015   Amit .................. G01N 21/4785
                                                         702/150
2015/0204664 A1*   7/2015   Bringoltz ........... G02B 27/4272
                                                         356/492
(Continued)

FOREIGN PATENT DOCUMENTS

KR    1020170063317 A    6/2017
WO      2017108444 A1    6/2017

OTHER PUBLICATIONS

WIPO, ISR for PCT/US2019/053716, dated Jan. 13, 2020.

*Primary Examiner* — Hoa Q Pham
(74) *Attorney, Agent, or Firm* — Hodgson Russ LLP

(57) ABSTRACT

Metrology targets and methods are provided, which comprise at least two overlapping structures configured to be measurable in a mutually exclusive manner at least at two different corresponding optical conditions. The targets may be single cell targets which are measured at different optical conditions which enable independent measurements of the different layers of the target. Accordingly, the targets may be designed to be very small, and be located in-die for providing accurate metrology measured of complex devices.

18 Claims, 4 Drawing Sheets

(58) Field of Classification Search
CPC .... G03F 1/42; G01N 21/956; G01N 21/4788;
G01N 21/47; G01N 21/95; G01N
21/4785; G01N 21/9501; G01N 2201/12;
G01N 2201/02; G01B 11/27; G01B
11/272; H01L 21/681; H01L 21/67288;
H01L 22/12
USPC .......... 356/399–401, 237.1–237.5, 445–448;
250/237 G
See application file for complete search history.

(56) References Cited

U.S. PATENT DOCUMENTS

| | | |
|---|---|---|
| 2015/0346605 A1 | 12/2015 | Den Boef et al. |
| 2016/0266505 A1* | 9/2016 | Amit .................. G03F 7/70633 |
| 2018/0106735 A1 | 4/2018 | Gellineau et al. |
| 2018/0252514 A1* | 9/2018 | Pandev .............. G03F 7/70633 |
| 2018/0321597 A1* | 11/2018 | Javaheri ............ G01M 11/0264 |
| 2018/0328868 A1 | 11/2018 | Bykanov et al. |
| 2021/0072650 A1* | 3/2021 | Feler .................. G03F 7/70633 |

* cited by examiner

SINGLE CELL IN-DIE METROLOGY TARGETS AND MEASUREMENT METHODS

CROSS REFERENCE TO RELATED APPLICATIONS

This application claims the benefit of U.S. Provisional Patent Application No. 62/774,471 filed on Dec. 3, 2018, which is incorporated herein by reference in its entirety.

BACKGROUND OF THE INVENTION

1. Technical Field

The present invention relates to the field of semiconductor metrology, and more particularly, to single cell targets.

2. Discussion of Related Art

Metrology measurements are a crucial component in semiconductor technology, which faces stringent requirements with respect to measurement accuracy, real-estate (wafer area) use and throughput.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a metrology target comprising at least two overlapping structures configured to be measurable in a mutually exclusive manner at least at two different corresponding optical conditions.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
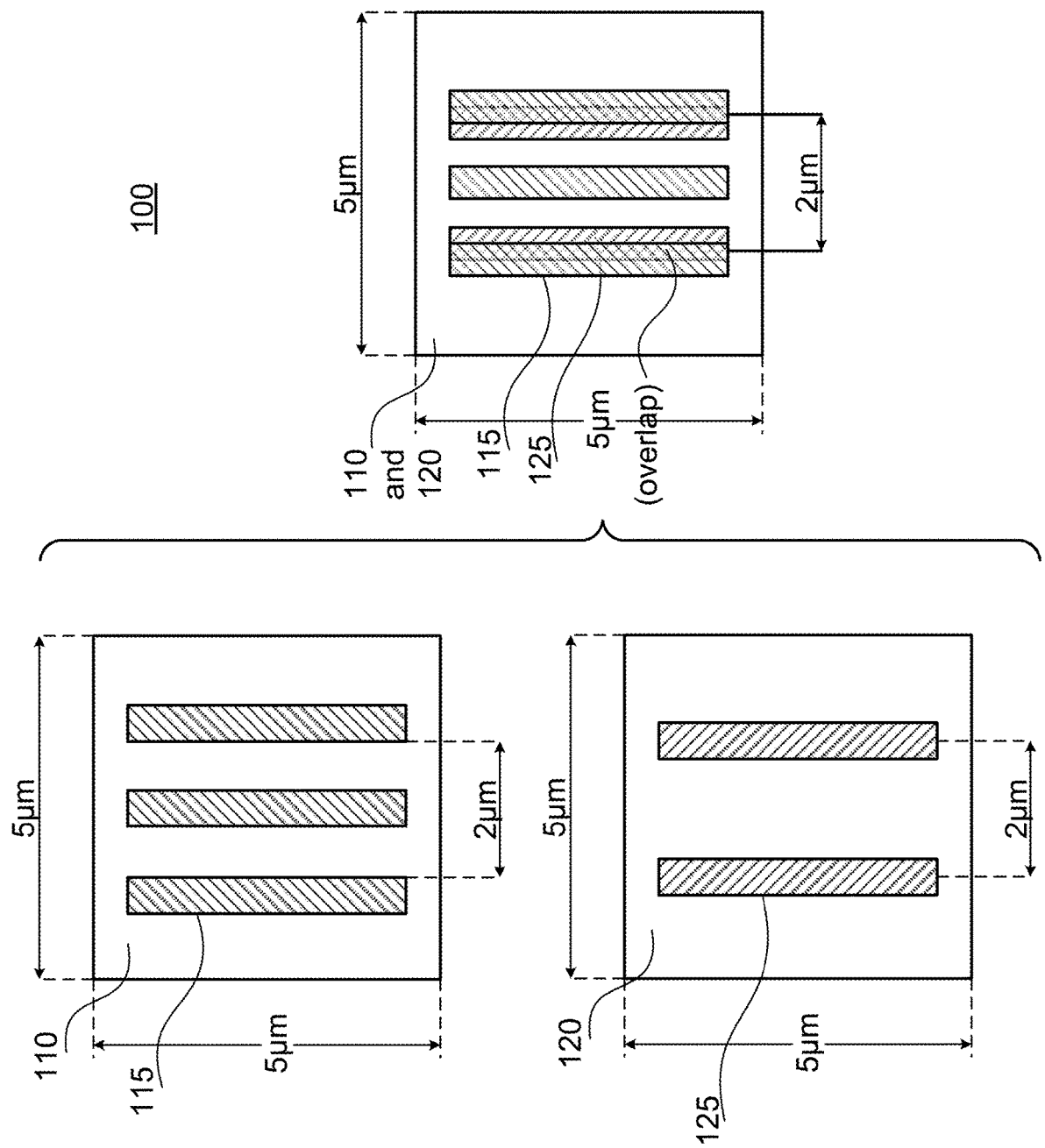
FIGS. 1 and 2 are high-level schematic illustrations of metrology targets, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in the visual range, ultraviolet or even shorter wave radiation such as x rays, and possibly even particle beams.

Embodiments of the present invention provide efficient and economical methods and mechanism for designing metrology targets and for carrying out metrology measurements and thereby provide improvements to the technological field of semiconductor metrology. Metrology targets and methods are provided, which comprise at least two overlapping structures configured to be measurable in a mutually exclusive manner at least at two different corresponding optical conditions. The targets may be single cell targets which are measured at different optical conditions which enable independent measurements of the different layers of the target. Accordingly, the targets may be designed to be very small, and be located in-die for providing accurate metrology measured of complex devices.

Disclosed targets may be designed to implement a broad range of metrology target types, such as imaging targets (both optical and SEM—scanning electron microscopy) and scatterometry targets (both "grating-over-grating" and "side-by-side" types)—reducing the required real estate by at least a factor of four for these targets (from typical prior art 10 μm×10 μm to disclosed target dimensions under 5 μm×5 μm). Disclosed targets may improve metrology performance with respect to SEM/eOVL (electron-beam overlay) targets, and reduce imaging target real estate by removing the typical requirement of a lateral separation between features representing current and previous layers (as in imaging target types BiB—box-in-box, AIM—advanced imaging metrology, BLOSSOM, AIMid, etc.). Advantageously, disclosed targets may be reduced in size down to 1.5 µm×1.5 µm, enabling in-die overlay measurements and/or scribe line real estate reduction.

Figure 2:
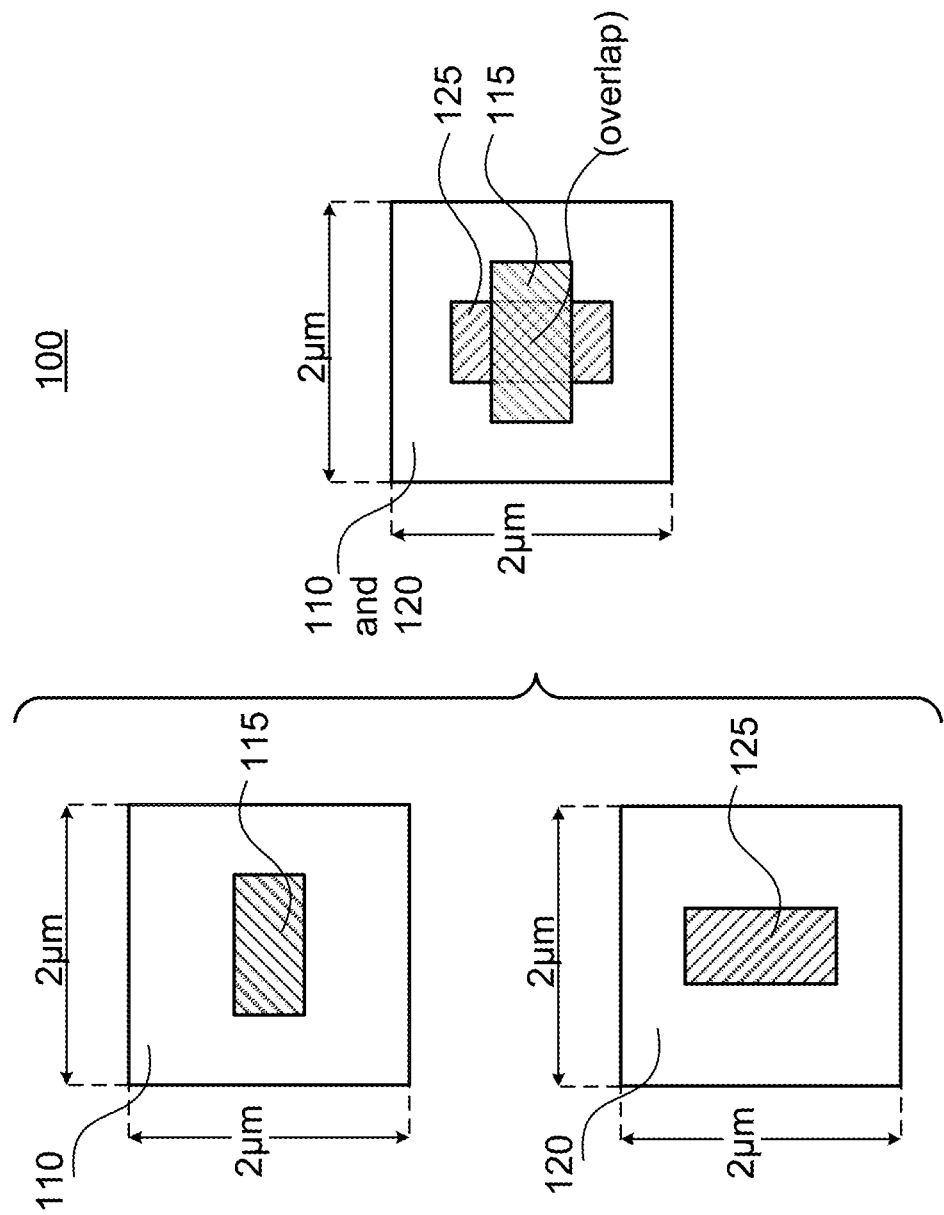

FIGS. 1 and 2 are high-level schematic illustrations of metrology targets 100, according to some embodiments of the invention. Metrology target 100 comprises at least two overlapping structures 115, 125 configured to be measurable in a mutually exclusive manner at least at two different corresponding optical conditions. Overlapping structures 115, 125 may be designed in any pair of corresponding layers 110, 120. In FIGS. 1 and 2, layers 110, 120 are shown separately and combined (overlapping), in top view. In the combined view, structures 115, 125 are illustrated in a partly transparent manner to show the overlap between them.

In various embodiments, illustrated e.g., in FIG. 1, at least one of overlapping structures 115, 125 may be periodic with a specified pitch P, e.g., in the order of magnitude of such as e.g., in illustrated structure 115 (P=1 µm) and/or as in illustrated structure 125 (P=2 µm). In certain embodiments, metrology targets 100 may comprise a single target cell, with overlapping layers 110, 120, that is smaller than 5 µm×5 µm, as presented e.g., in FIG. 1. Structures 115, 125 may be rotationally symmetric with coinciding centers of symmetry, and targets 100 may replace e.g., prior art AIMid targets.

In some embodiments, layers 110, 120 may be discriminated by optical conditions (for example: wavelength, focus, etc.) to make them measurable despite sharing the same real estate. For example, layers 110, 120 (and/or structures 115, 125) may be designed to have mutual exclusive visibility at different optical conditions, e.g., layer 110 visible/measurable at a first set of optical parameters or conditions in which layer 120 is less or not visible/measurable; and layer 120 visible/measurable at a second set of optical parameters or conditions in which layer 110 is less or not visible/measurable. For example, layer 110 in FIG. 1 may be measurable in long wavelengths (e.g., between 420-1000 nm) while layer 120 in FIG. 1 may be measurable in short wavelengths (e.g., between 380-420 nm). In particular, lower, previous layer 120 may be measured at wavelength to which top, current layer 110 is at least partly transparent. In certain embodiments, top, current layer 110 may be measured at short wavelengths (e.g., between 380-420 nm) and made of materials which are transparent at longer wavelengths (e.g., between 420-1000 nm), such as oxy-nitrides, poly-silicon and some organic layers as used for the resist layer, ARC (anti-reflective coatings), etc. It is noted that targets 100 may be multi-layered, with different layers measured using different sets of optical conditions.

In certain embodiments, the layer which is measured at shorter wavelengths may also comprise correspondingly smaller structures—leading to smaller area use and/or more features in a given area.

In certain embodiments, targets 100 used for thick stacks (e.g., as in V-NAND—Vertical NAND (NOT-AND)) may be measured using circularly polarized laser light (CPL), especially in short wavelengths, to separately resolve top layer 110 from bottom layer 120—using any of polarization, focus and/or wavelength as the different optical parameters.

Certain embodiments comprise in-die targets 100 for VNAND semiconductor devices and wafers, which are at most 4 µm×4 µm, fitting into the maximal room available in VNAND to accommodate overlay target 100. Advantageously, targets 110 are presently the only feasible solution for this case.

Certain embodiments comprise in-die targets 100 for DRAM (dynamic random-access memory) semiconductor devices and wafers, which are much smaller than 5 µm×5 µm, e.g., 4 µm×4 µm or smaller—fitting into the maximal room available in DRAM to accommodate overlay target 110. Advantageously, targets 100 are presently the only feasible solution for this case.

In certain embodiments, targets 100 may be positioned on scribe lines, reducing the required real estate therefore.

In certain embodiments, intermediate layers in the area of targets 100 may comprise assist or dummy elements, which may be used to minimize interference of radiation diffracted from bottom layer 120 with radiation diffracted from top layer 110 which is being measured. In certain embodiments, dummy structures may be designed according the first set of optical parameters and may be introduced to intermediate target layers. In certain embodiments, pattern on intermediate layer(s) may be designed to attenuate and/or block signals from lower, previous layer(s) for specified hardware configurations. For example, finely segmented intermediate layer structures may be configured to disperse radiation characterized by specific polarization (or any other optical) parameters stronger than radiation characterized by different optical parameters, which are used to measure the lower layers. In certain embodiments, even without specifically designed patterns, the intermediate layer(s) may exhibit some wavelength-dependent absorption (e.g., as do amorphous carbon and/or amorphous Si) which attenuate and/or block signals from previous layer at specified wavelengths that may be used to measure the top layer(s).

Targets 100 may be designed in MTD (Metrology Target Design) simulations to reach the condition of layer 110 being visible in a first set of optical conditions, and layer 120 being visible in a second and different set of optical conditions. Practically, the mutual exclusive visibility at different optical conditions requires, e.g., that the visibility of layer 110 under the first set of optical conditions is much better than the visibility of layer 120 under the first set of optical conditions—to the extent that independent measurement of layer 110 is possible and/or that a good-enough overlay measurement is derived; and that the visibility of layer 120 under the second set of optical conditions is much better than the visibility of layer 110 under the second set of optical conditions—to the extent that independent measurement of layer 120 is possible and/or that a good-enough overlay measurement is derived. The "good-enough" requirement may be selected as increasing information content of one of the measured layers, possibly supported by modifying its design, such as adding features or making them larger that can also be analyzed in simulations. While a certain increase in target element size may be required, targets 100 are still significantly smaller than prior art targets 90. For example, referring to FIG. 1, it is noted that layer 110 includes three elements in structure 115, while layer 120 includes only two elements in structure 125. Thus, for equal contrast of the elements, the information content of layer 110 is higher than the information content of layer 120. When the contrast of layers 110, 120 is not equal, more elements and/or larger information content may be assigned to the layer for which a lower contrast is anticipated, to improve the overall target performance. Correspondingly, the information content of the target layers may be adjusted with respect to their expected or actual optical performance.

In various embodiments, illustrated e.g., in FIG. 2, overlapping structures 115, 125 may be mutually orthogonal. In certain embodiments, metrology targets 100 may comprise a single target cell that is smaller than 1.5 µm×1.5 µm, as presented e.g., in FIG. 2. Structures 115, 125 represent further reduction in size in FIG. 2 with respect to FIG. 1, to a single centrally symmetric feature in each layer 110, 120, respectively. Certain embodiments comprise combinations of single-element structure(s) and periodic structure(s), e.g., at different layers.

Metrology targets 100 may be configured to be set in-die due to its small size and/or be positioned on scribe lines, reducing the required real estate therefore.

Figure 3:
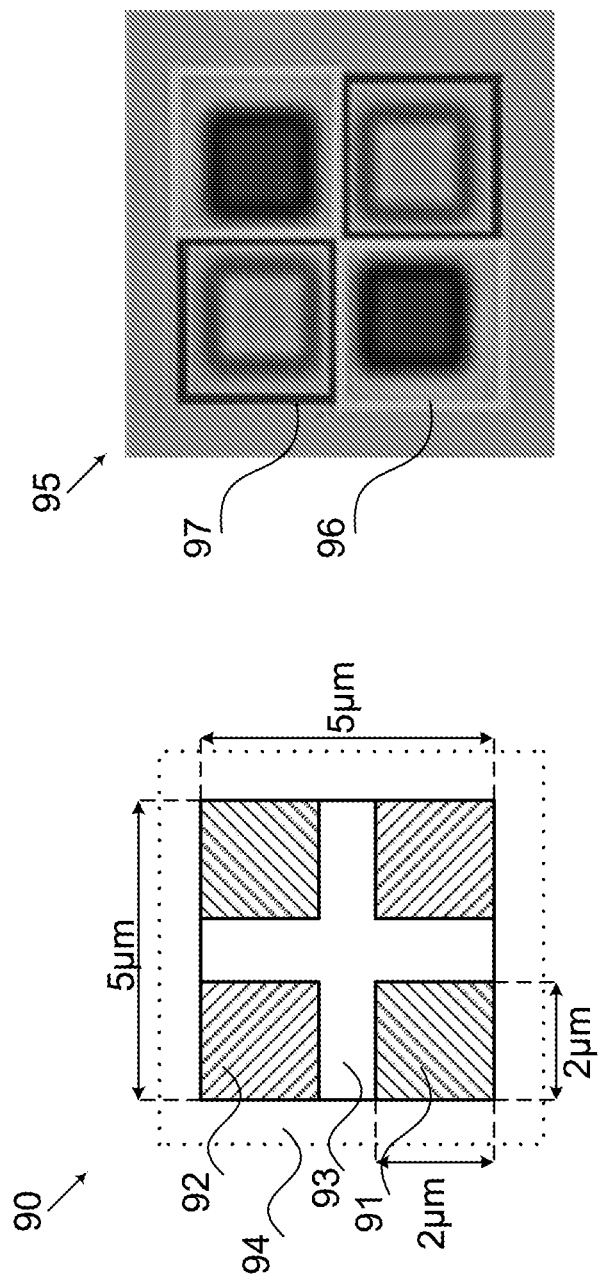
FIG. 3 illustrates a prior art AIMid target and its image by a metrology tool.

FIG. 3 illustrates a prior art AIMid target 90 and its image 95 by a metrology tool. Typical AIMid targets 90 comprise current layer 91 and previous layer 92 having non-overlapping and separated features (structures) that have the same center of symmetry, e.g., each layer 91, 92 comprises two features. Overall, target 90 comprises four features, which accommodate wafer real estate. In resulting image 95, regions of interest (ROIs) are 96, 97 denoted with respect to target features in layers 91, 92, respectively. For example, in the illustrated example, each feature is 2 µm×2 µm and some separation 93 is left between the features (e.g., 0.51 µm) to allow separating information coming from one layer from information coming from the other layer, yielding 5 µm×5 µm for the features, plus an additional required exclusion area 94 surrounding target 90 to ensure separation between overlay information from target 90 and information resulting from surrounding structures, leading to prior art AIMid targets 90 larger than 5 µm×5 µm. The inventors note that not only are prior art AIMid targets 90 larger, a significant portion of their area (real estate) is dedicated to spacing between features rather than to measured structures. For example, in the illustrated prior art example of FIG. 3, the total feature area is 4·2×2 µm²=16 µm² while the spacing includes ca. 9 µm² separation 93 and 12-24 µm² exclusion area 94 (assuming it is 0.5-1 µm wide, respectively)—leading to 16/37=43% to 16/49=33% (respectively) target area occupied by the target features.

In contrast to prior art targets 90, disclosed targets 100 use the target area more efficiently, and the ratio between the utilized target area and the required unused target perimeter is smaller as well as better scalable with shrinking target size. It is noted that prior art targets 90 require two types of unused area (which may potentially lead to signal contamination): (i) internal intervals 93 (e.g., strips) separating between features belonging to different layers 91, 92, and (ii) external intervals 94 (e.g., strips), which typically surround the target, separating between the measured features and the target exterior with features that potentially surround the target. Disclosed targets 100 remove the need for internal intervals 93 between target features in different layers, as the signals from layers 110, 120 are distinguished by their optical properties rather than by prior art spatial separation. As the different optical conditions reduce or eliminate the cross-talk between the target layers, layers 110, 120 are not captured on the same image (as in the prior art see image 95 in FIG. 3). In this way, targets 100 are more efficient in their ability to use the internal area which in the prior art must be used for internal intervals 93—practically most or all of the overlapping feature area between layers 110, 120 is used twice in disclosed targets 100. With respect to prior art external intervals 94, while targets 100 do not eliminate the need to design an unused target periphery, the part they take in the target real estate is smaller than in prior art targets 90 and therefore smaller targets 100 are enabled.

Figure 4:
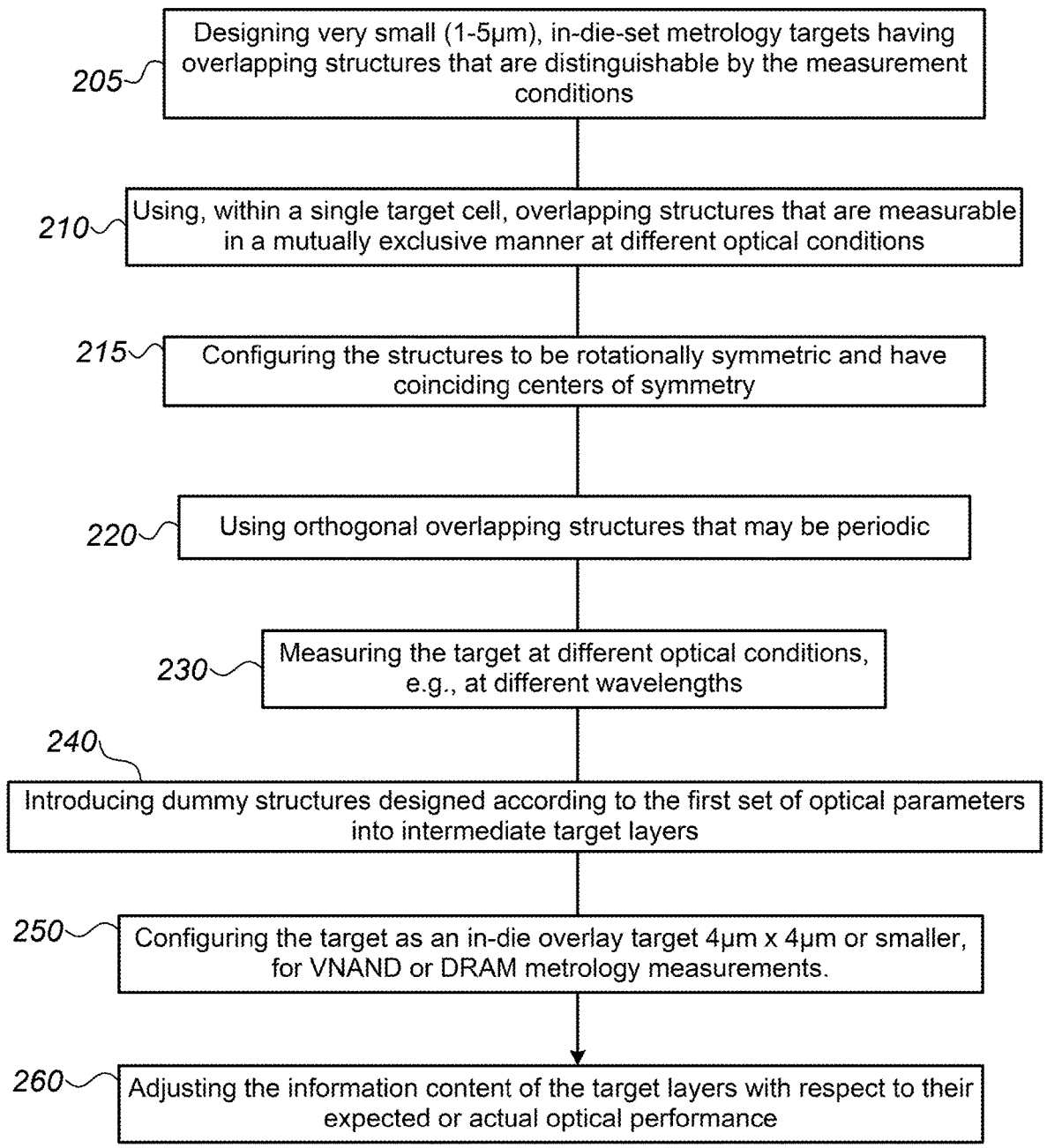
FIG. 4 is a high-level flowchart illustrating a method, according to some embodiments of the invention.

FIG. 4 is a high-level flowchart illustrating a method 200, according to some embodiments of the invention. The method stages may be carried out with respect to targets 100 described above, which may optionally be configured to implement method 200. Method 200 may be at least partially implemented by at least one computer processor, e.g., in a target design and/or in a metrology measurement module. Certain embodiments comprise computer program products comprising a computer readable storage medium having computer readable program embodied therewith and configured to carry out the relevant stages of method 200. Certain embodiments comprise target design files of respective targets designed by embodiments of method 200. Certain embodiments comprise metrology measurements of targets designed by method 200. Method 200 may comprise the following stages, irrespective of their order.

Method 200 may comprise a metrology target design method comprising designing very small (1-5 µm), in-die-set metrology targets having overlapping structures that are distinguishable by the measurement conditions (stage 205). Method 200 may comprise using, within a single target cell, at least two overlapping structures configured to be measurable in a mutually exclusive manner at least at two different cor-responding optical conditions (stage 210) and/or a measurement method comprising measuring the target at different optical conditions, e.g., at different wavelengths (stage 230) and deriving a metrology metric from the measurements. In various embodiments, measurements may be carried out in several shots, switching between optical conditions between the shots, or simultaneously by multiple sensors, e.g., using two or more cameras designed to register signals at different optical conditions such as wavelengths, foci, etc. Corresponding optical architectures may be any which are used to measure imaging targets and used in imaging metrology.

Method 200 may further comprise configuring the structures to be rotationally symmetric and have coinciding centers of symmetry (stage 215). Method 200 may further comprise designing the at least two overlapping structures to be mutually orthogonal and possibly designing at least one of the at least two overlapping structures to be periodic (stage 220).

In certain embodiments, method 200 may comprise introducing dummy structures designed according to the first set of optical parameters into intermediate target layers (stage 240)—to enhance measurements of the top layer while attenuating interference of radiation diffracted from the bottom layer(s).

In certain embodiments, method 200 may comprise designing the single target cell to be smaller than 5 µm×5 µm and possibly smaller than 1.5 µm×1.5 µm, to be set in-die, e.g., further comprising configuring the target as an in-die overlay target 4 µm×4 µm or smaller, for VNAND or DRAM metrology measurements (stage 250).

In certain embodiments, method 200 may further comprise adjusting the information content of the target layers with respect to their expected or actual optical performance (stage 260).

Elements from FIGS. 1, 2 and 4 may be combined in any operable combination, and the illustration of certain elements in certain figures and not in others merely serves an explanatory purpose and is non-limiting.

Advantageously, disclosed targets 100 and methods 200 shrink the real estate required for metrology measurements significantly, potentially enabling in-die overlay metrology that potentially provides more accurate and robust overlay control. In certain embodiments, targets 100 may be used particularly in critical layers of the design to enhance the accuracy of their metrology measurements.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology target comprising a cell and at least two overlapping structures within the cell configured to be measurable in a mutually exclusive manner at least at two different corresponding optical conditions, wherein the at least two overlapping structures are mutually orthogonal.

2. The metrology target of claim 1, wherein the structures are rotationally symmetric and have coinciding centers of symmetry.

3. The metrology target of claim 1, wherein at least one of the at least two overlapping structures is periodic.

4. The metrology target of claim 1, having a single target cell that is smaller than 5 µm×5 µm.

5. The metrology target of claim 4, having a single target cell that is smaller than 1.5 µm×1.5 µm.

6. The metrology target of claim 4, configured as an overlay target for vertical NAND (VNAND) or dynamic random-access memory (DRAM) metrology measurements.

7. The metrology target of claim 1, set in-die.

8. A target design file of the metrology target of claim 1.

9. The metrology target of claim 1, wherein the two different corresponding optical conditions are wavelengths, wherein one of the at least two overlapping structures is exclusively visible at a first of the wavelengths, and wherein another of the at least two overlapping structures is exclusively visible at a second of the wavelengths.

10. A method comprising designing a metrology target using, within a single target cell, at least two overlapping structures configured to be measurable in a mutually exclusive manner at least at two different corresponding optical conditions, wherein the at least two overlapping structures are designed to be mutually orthogonal.

11. The method of claim 10, further comprising configuring the structures to be rotationally symmetric and have coinciding centers of symmetry.

12. The method of claim 10, further comprising designing the single target cell to be smaller than 5 µm×5 µm.

13. The method of claim 12, further comprising designing the single target cell to be smaller than 1.5 µm×1.5 µm.

14. The method of claim 10, further comprising designing at least one of the at least two overlapping structures to be periodic.

15. The method of claim 10, further comprising setting the single target cell in-die.

16. The method of claim 15, further comprising configuring the target as an overlay target for vertical NAND (VNAND) or dynamic random-access memory (DRAM) metrology measurements.

17. The method of claim 10, further comprising measuring the target at the different optical conditions, and deriving a metrology metric from the measurements.

18. A computer program product comprising a non-transitory computer readable storage medium having computer readable program embodied therewith, the computer readable program configured to design a metrology target using, within a single target cell, at least two overlapping structures configured to be measurable in a mutually exclusive manner at least at two different corresponding optical conditions, wherein the at least two overlapping structures are designed to be mutually orthogonal.

* * * * *